(12) United States Patent
Nellissen

(10) Patent No.: US 7,154,674 B2
(45) Date of Patent: Dec. 26, 2006

(54) IMAGING METHOD

(75) Inventor: Antonius Johannes Maria Nellissen, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/510,785

(22) PCT Filed: Apr. 14, 2003

(86) PCT No.: PCT/IB03/01372

§ 371 (c)(1),
(2), (4) Date: Oct. 12, 2004

(87) PCT Pub. No.: WO03/087946

PCT Pub. Date: Oct. 23, 2003

(65) Prior Publication Data

US 2005/0146793 A1    Jul. 7, 2005

(30) Foreign Application Priority Data

Apr. 15, 2002   (EP)   .................. 02076459

(51) Int. Cl.
*G02B 27/10* (2006.01)
*G03B 27/54* (2006.01)
(52) U.S. Cl. .......................... 359/619; 355/67
(58) Field of Classification Search ................ 359/619, 359/621, 622; 349/2–4; 355/53, 67
See application file for complete search history.

(56) References Cited

U.S. PATENT DOCUMENTS 4,838,652 A * 6/1989 Inaba et al. ................... 349/2
2002/0159044 A1* 10/2002 Mei et al. ..................... 355/53

* cited by examiner

*Primary Examiner*—Alicia M Harrington

(57) ABSTRACT

An optical image is formed in a radiation-sensitive layer (5), by a number of sub-illuminations, in each of which an array of light valves (21–25) and a corresponding array of converging elements (91–95) are used to form a pattern of spots (111–115) in the resist layer in accordance with a sub-image pattern. Between the sub-illuminations, the resist layer is displaced relative to the arrays. Bright and well-defined spots are obtained by using effective lenses (43) as converging elements. The radiation-sensitive layer may be a resist layer on top of a substrate wherein a device is to be configured by means of lithography or an electrostatic charged layer used in a printer.

16 Claims, 10 Drawing Sheets

IMAGING METHOD

Figure 1:
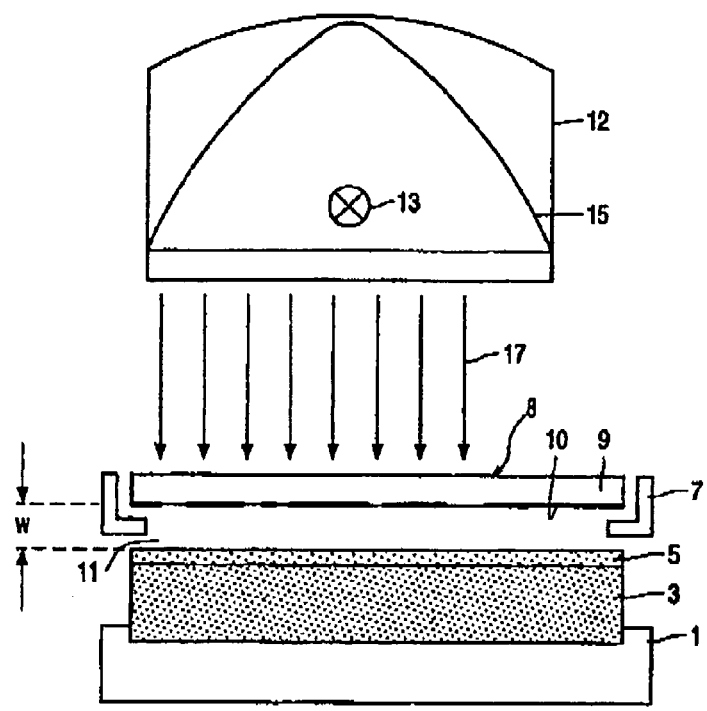

The invention relates to a method of forming an optical image in a radiation-sensitive layer, the method comprising the steps of:
providing a radiation source;
providing a radiation-sensitive layer;
positioning a two-dimensional array of individually controlled light valves between the radiation source and the radiation-sensitive layer;
positioning a two-dimensional array of radiation-converging elements between the array of light valves and the radiation-sensitive layer, such that each converging element corresponds to a different one of the light valves and serves to converge radiation from the corresponding light valve in a spot area in the radiation-sensitive layer;
simultaneously writing image portions in radiation-sensitive layer areas by scanning said layer, on the one hand, and the associated light valves/converging element pairs, on the other hand, relative to each other and switching each light valve between an on and an off state in dependence upon the image portion to be written by the light valve.

The invention also relates to an apparatus for carrying out this method and to a method of manufacturing a device using this method.

An array of light valves, or optical shutters, is understood to mean an array of controllable elements, which can be switched between two states. In one of the states radiation incident on such an element is blocked and in the other state the incident radiation is transmitted or reflected to follow a path that is prescribed in the apparatus of which the array forms part.

Such an array may be a transmissive or reflective liquid crystal display (LCD) or a digital mirror device (DMD). The radiation-sensitive layer is, for example, a resist layer used in optical lithography, or an electrostatic charged layer used in a printing apparatus.

This method and apparatus may be used, inter alia, in the manufacture of devices such as liquid crystal display (LCD) panels, customized-ICs (integrated circuits) and PCBs (printed circuit board). Currently, proximity printing is used in the manufacture of such devices. Proximity printing is a fast and cheap method of forming an image in a radiation-sensitive layer on a substrate of the device, which image comprises features corresponding to device features to be configured in a layer of the substrate. Use is made of a large photomask that is arranged at a short distance, called the proximity gap, from the substrate, and the substrate is illuminated via the photomask by, for example, ultraviolet (UV) radiation. An important advantage of the method is the large image field, so that large device patterns can be imaged in one image step. The pattern of a conventional photomask for proximity printing is a true, one-to-one copy, of the image required on the substrate, i.e. each picture element (pixel) of this image is identical to the corresponding pixel in the mask pattern.

Proximity printing has a limited resolution, i.e. the ability to reproduce the points, lines etc., in general the features, of the mask pattern as separate entities in the sensitive layer on the substrate. This is due to the diffractive effects, which occur when the dimensions of the features decrease with respect to the wavelength of the radiation used for imaging. For example, for a wavelength in the near UV range and a proximity gap width of 100 µm, the resolution is 10 µm, which means that pattern features at a mutual distance of 10 µm can be imaged as separate elements.

To increase the resolution in optical lithography, a real projection apparatus is used, i.e. an apparatus having a real projection system like a lens projection system or a mirror projection system. Examples of such apparatus are wafer steppers or wafer step-and scanners. In a wafer stepper, a whole mask pattern, for example, an IC pattern is imaged in one go by a projection lens system on a first IC area of the substrate. Then the mask and substrate are moved (stepped) relative to each other until a second IC area is positioned below the projection lens. The mask pattern is then imaged on the second IC area. These steps are repeated until all IC areas of the substrate are provided with an image of the mask pattern. This is a time-consuming process, due to the sub-steps of moving, aligning and illumination. In a step-and-scanner, only a small portion of the mask pattern is illuminated at once. During illumination, the mask and the substrate are synchronously moved with respect to the illumination beam until the whole mask pattern has been illuminated and a complete image of this pattern has been formed on an IC area of the substrate. Then the mask and substrate are moved relative to each other until the next IC area is positioned under the projection lens and the mask pattern is again scan-illuminated, so that a complete image of the mask pattern is formed on the next IC area These steps are repeated until all IC areas of the substrate are provided with a complete image of the mask pattern. The step-and-scanning process is even more time-consuming than the stepping process.

If a 1:1 stepper, i.e. a stepper with a magnification of one, is used to print a LCD pattern, a resolution of 3 µm can be obtained, however, at the expense of much time for imaging. Moreover, if the pattern is large and has to be divided into sub-patterns, which are imaged separately, stitching problems may occur, which means that neighboring sub-fields do not fit exactly together.

The manufacture of a photomask is a time-consuming and cumbersome process, which renders such a mask expensive. If much re-design of a photomask is necessary or in case customer-specific devices, i.e. a relatively small number of the same device, have to be manufactured, the lithographic manufacturing method using a photomask is an expensive method.

The paper: "Lithographic patterning and confocal imaging with zone plates" of D. Gil et al in: J. Vac. Sci. Technology B 18(6), Nov/December 2000, pages 2881–2885, describes a lithographic method wherein, instead of a photomask, a combination of a DMD array and an array of zone plates is used. If the array of zone plates, also called Fresnel lenses, is illuminated, it produces an array of radiation spots, in the experiment described in the paper: an array of 3×3 X-ray spots, on a substrate. The spot size is approximately equal to the minimum feature size, i.e. the outer zone width, of the zone plate. The radiation to each zone plate is separately turned on and off by the micromechanic means of the DMD device, and arbitrary patterns can be written by raster scanning the substrate through a zone plate unit cell. In this way, the advantages of maskless lithography are combined with a high throughput due to parallel writing with an array of spots.

Zone plates, or other similar elements which may be used instead, are diffraction elements, i.e. they split an incident radiation beam into sub-beams of different diffraction orders. The geometry of the diffraction elements is designed in such a way that radiation portions of the different diffraction orders constructively interfere in a small spot area and destructively interfere outside this spot area, so that theoretically a small radiation spot is formed. In practice, however, constructive interference also occurs outside said spot area so that the spot is smeared out. In other words, the diffraction element does not provide a sharp focus. Moreover, diffraction elements are designed for a specific wavelength, and if the illumination beam comprises a wavelength component, which is different from said specific wavelength image aberrations, chromatic aberrations will occur. This means that a broad wavelength source, such as a mercury arc lamp, which is conventionally used in this kind of lithographic apparatus, can no longer be used. Also the wavelength of radiation emitted by a laser source may show small variations, which may affect the performance of a lithographic imaging apparatus using diffraction elements, because of the small size of the spots to be formed.

It is an object of the present invention to solve the above-mentioned problems and to provide an accurate and radiation-efficient lithographic imaging method, which may employ different kinds of radiation sources. This method is characterized in that use is made of converging elements in the form of refractive lenses, and in that the two arrays are used for forming a matrix array of spots having a pitch, which is substantially larger than the spot size.

The performance of refractive lenses is considerably less sensitive to wavelength variations, so that chromatic aberrations can be avoided. These lenses have a sharper focus than diffraction elements, because they show no order splitting.

A matrix array of spots is understood to mean a two-dimensional array having a comparable, albeit not necessarily the same, number of spots in two, mutually perpendicular directions. The matrix pitch may be of the order of a hundred times the spot size.

It is remarked that U.S. Pat. No. 6,288,830 discloses an optical image-forming method and device wherein a digital mirror device and an array of microlenses are used. According to the known method, the image is written line-by-line, and in order to obtain a high pixel density, each image line is written by means of a number n, for example six, mirror rows. The mirrors of each row are shifted over a distance p/n with respect to the light valves of the other lines, wherein p is the pitch of the mirrors in one row. In the known method, a single image pixel is written by means of corresponding pixels of all of the n rows, which row pixels are shifted relative to each other in the row direction. In the method of the present invention, each light valve is used to successively write a large number of pixels, i.e. all pixels of, for example a radiation-sensitive layer area having dimensions corresponding to the matrix pitch.

A first embodiment of the method is characterized in that said scanning is such that each spot scans its own associated layer area, which area has dimensions corresponding to the matrix pitch.

According to this method, each light valve is used to write only one layer area, hereinafter referred to as light valve area, by two-dimensionally scanning the spot from this light valve across this associated light valve area. After a spot has scanned a line within the light valve area, this spot and the area are moved relative to each other in a direction perpendicular to the scanning direction, where after a subsequent line within this area is scanned.

A second embodiment of the method is characterized in that the matrix of spots and the radiation-sensitive layer are scanned relative to each other in a direction at a small angle to the direction of the lines of spots in the matrix, and in that the scanning is carried out over a length, which is substantially larger than the matrix pitch.

According to this embodiment, all spots of all lines are used to scan different lines, and a layer area having a width corresponding to the total number of spots times the size of a spot and an arbitrary length can be scanned by means of one scanning action, without movement in a direction perpendicular to the scanning direction.

The method of the present invention may be further characterized in that, between successive sub-illuminations, the radiation-sensitive layer and the arrays are displaced relative to each other over a distance which is at most equal to the size of the spots formed in the radiation-sensitive layer.

In this way, image, i.e. pattern, features can be written with a constant intensity across the whole feature. The spots may have a circular, square, diamond or rectangular shape, dependent on the design of a beam-shaping aperture present in the apparatus. The size of the spot is understood to mean the size of the largest dimension within this spot.

If features of the image to be written are very close to each other, these features may broaden and blend with each other, which phenomenon is known as the proximity effect. An embodiment of the method, which prevents proximity effects from occurring, is characterized in that the intensity of a spot at the border of an image feature is adapted to the distance between this feature border and a neighboring feature.

The method can be used in several applications. A first application is in the field of optical lithography. An embodiment of the method, which is suitable to form part of a lithographic process for producing a device in a substrate, is characterized in that the radiation-sensitive layer is a resist layer provided on the substrate, and in that image pattern corresponds to the pattern of features of the device to be produced.

This embodiment of the method may be further characterized in that the image is divided into sub-images each belonging to a different level of the device to be produced, and in that, during formation of the different sub-images, the resist layer surface is set at different distances from the array of refractive lenses.

This embodiment of the method allows imaging on different planes of the substrate and thus production of multiple level devices.

A second application is in the field of printing. An embodiment of the method, which is suitable to form part of a process for printing a sheet of paper, is characterized in that the radiation-sensitive layer is a layer of electrostatically charged material.

The method may be further characterized in that the array of light valves is positioned to directly face the array of refractive lenses.

The two arrays are positioned close to each other, without imaging means being arranged between them, so that the method can be performed by compact means. If the array of light valves is an array of LCD cells, which modulate the polarization of incident radiation, a polarization analyzer is arranged between the LCD and the array of diffraction cells.

Alternatively, the method may be characterized in that the array of light valves is imaged on the array of diffraction cells.

Imaging one array on the other by a projection lens provides advantages with respect to stability, thermal effects, and crosstalk.

The invention also relates to an apparatus for carrying out the method described above. This apparatus comprises:

a radiation source;
positioning means for positioning a radiation-sensitive layer relative to the radiation beam;
a two-dimensional array of individually controllable light valves arranged between the source and the location for the radiation-sensitive layer; and
an imaging element comprising an array of radiation-converging elements arranged between the array of light valves and the location of the radiation-sensitive layer, such that each converging element corresponds to a different one of the light valves and serves to converge radiation from the corresponding light valve in a spot area in the resist layer.

This apparatus is characterized in that the converging elements are refractive lenses.

With this apparatus, arbitrary image patterns can be written by scanning the radiation-sensitive layer with a number of sharp spots simultaneously, wherein efficient use is made of the available radiation.

A first embodiment of the apparatus, suitable for forming an image in a resist layer on a substrate, which image comprises features corresponding to device features to be configured in said substrate, is characterized in that the radiation-sensitive layer is a resist layer, and in that the positioning means is a substrate holder carried by a substrate stage.

This embodiment may be adapted to allow sub-images to be formed in different planes of the substrate and is then characterized in that it comprises means for adapting the distance between the resist layer surface and the array of refractive lenses when forming different sub-images.

A second embodiment of the apparatus is suitable for printing data on a sheet of paper, is characterized in that the radiation-sensitive layer is a layer of electrostatically charged radiation-sensitive material, and in that the positioning means are means for moving said layer relative to the array of light valves and the array of refractive lenses and for sustaining said layer at the location of the image field of these arrays.

The term data is understood to encompass all visual information that can be printed on paper, such as text, graphics, photos, etc.

The apparatus may be further characterized in that the imaging element is arranged behind the array of light valves without intervening imaging means.

The gap, for example an air gap, may be very small so that this embodiment has a sandwich shape. If the array of light valves is a LCD, a polarization analyzer is arranged between the array of light valves and the imaging element.

An embodiment of the apparatus, which is alternative to the sandwich embodiment, is characterized in that a projection lens is arranged between the array of light valves and the array of refractive lenses.

The projection lens images each light valve on its associated refractive lens in the imaging element so that crosstalk, optical aberrations and temperature effects are eliminated. Moreover, the substrate of the imaging element may be relatively thick so that the apparatus is more stable.

The invention also relates to a method of manufacturing a device in at least one process layer of a substrate, the method comprising the steps of:
forming an image, comprising features corresponding to device features to be configured in the process layer, in a resist layer provided on the process layer; and
removing material from, or adding material to, areas of the process layer which areas are delineated by the image formed in the resist layer.

This method is characterized in that the image is formed by means of the method as described above.

Devices, which can be manufactured by means of this method and apparatus, are liquid crystal display devices, customer-specific ICs, electronic modules, printed circuit boards and MOEMS (integrated Micro-Optical-Electrical-Mechanical System), etc. An example of such a device is an integrated optical telecommunication device comprising a diode laser and/or detector, a light guide, an optical switch and possibly a lens between the light guide and the diode laser, or the detector.

These and other aspects of the invention are apparent from and will be elucidated, by way of non-limitative example, with reference to the embodiments described hereinafter.

Figure 2:
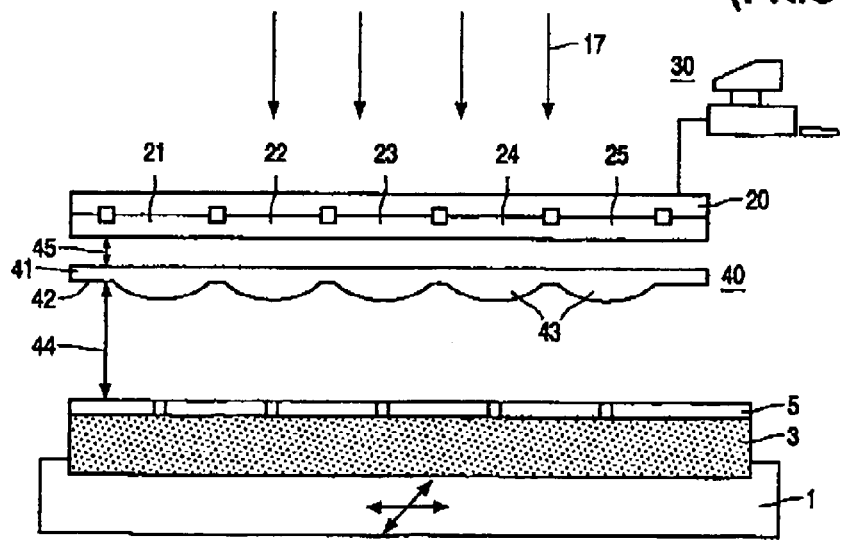
Figure 3A:
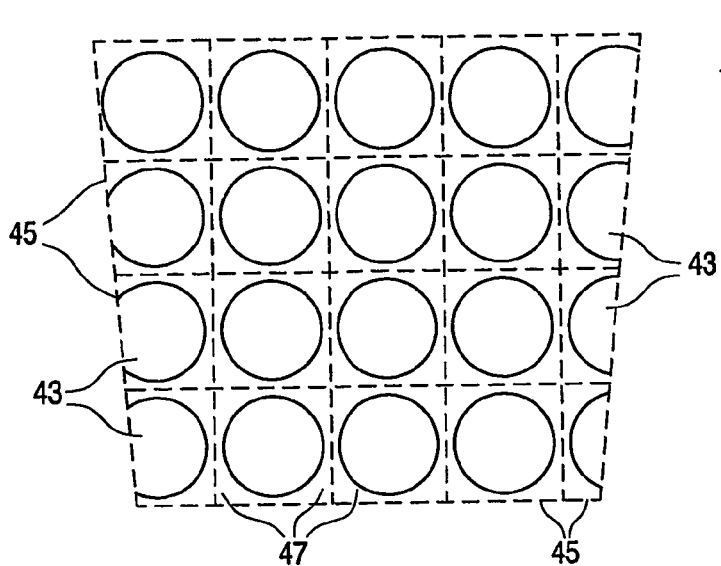
Figure 3B:
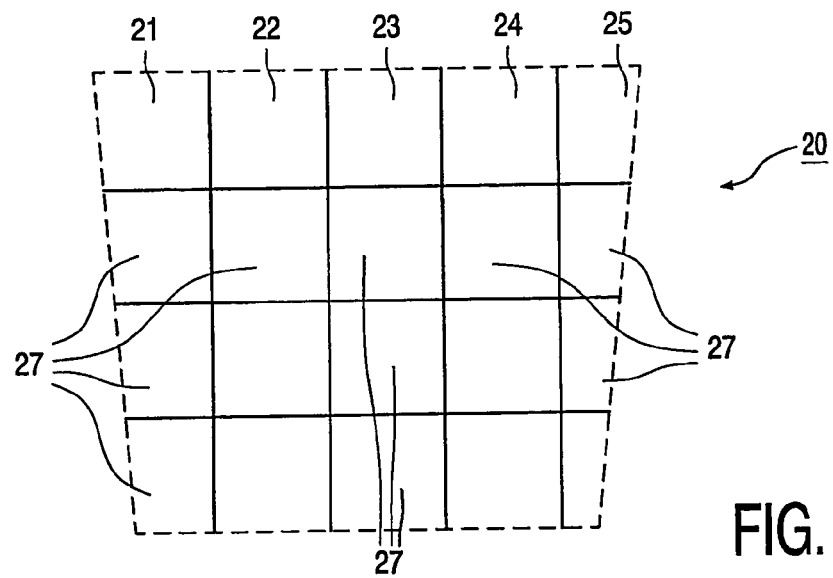
Figure 3C:
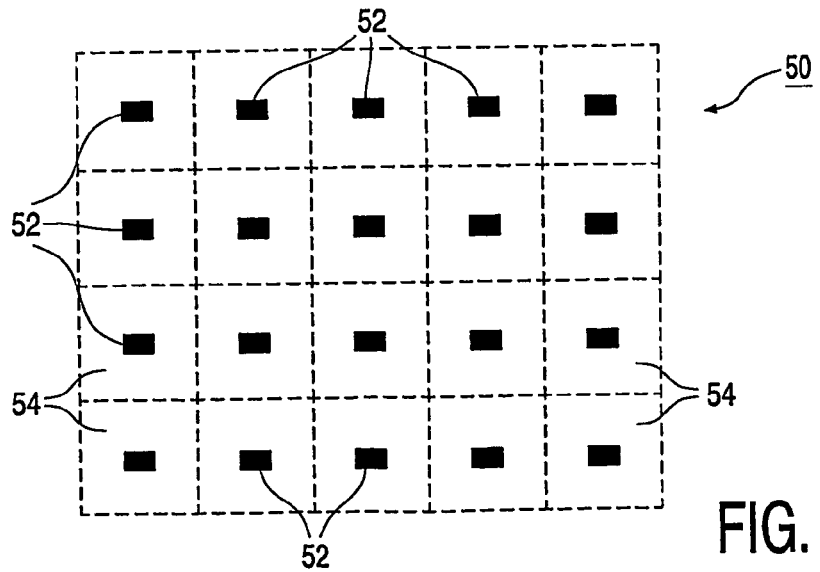
Figure 4A:
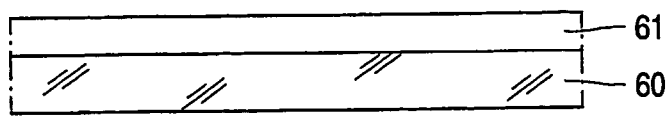
Figure 4B:
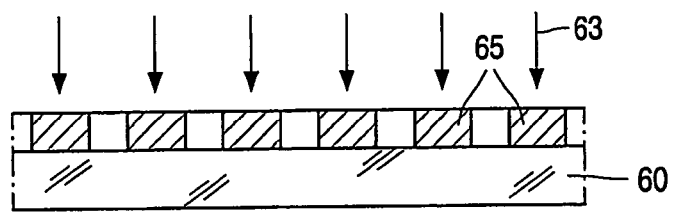
Figure 4C:
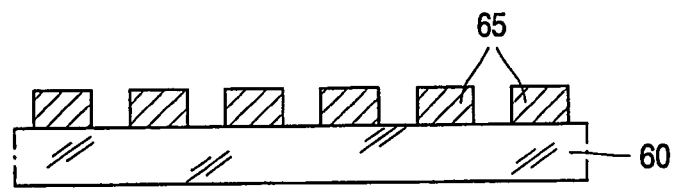
Figure 4D:
Figure 4E:
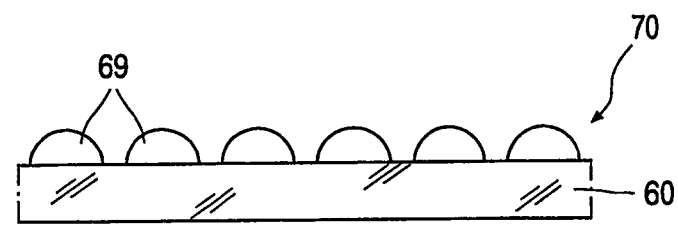
Figure 4F:
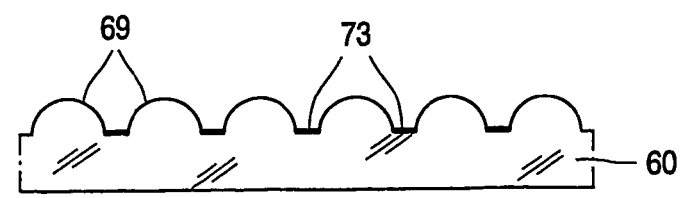
Figure 5:
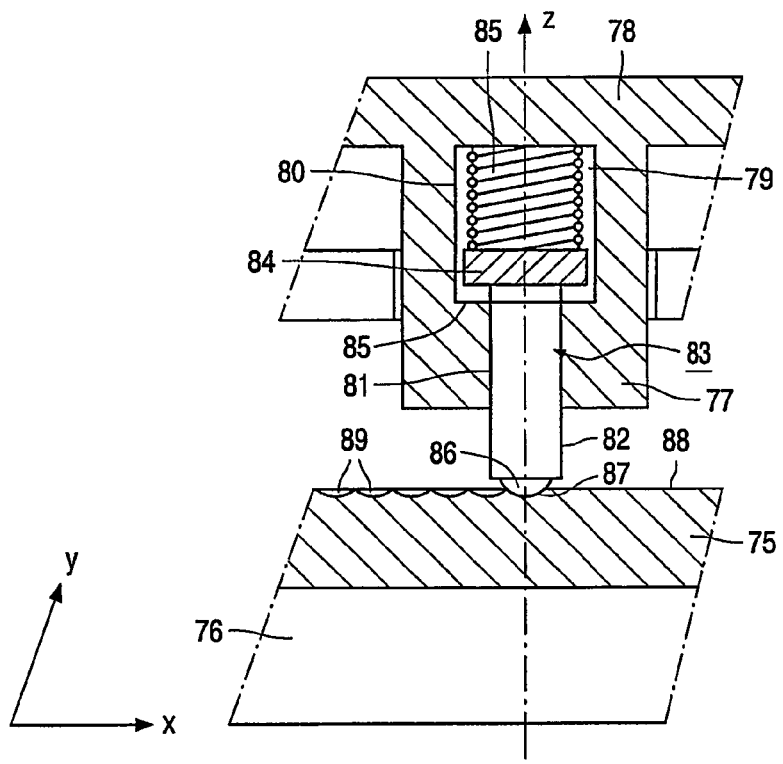
Figure 6A:
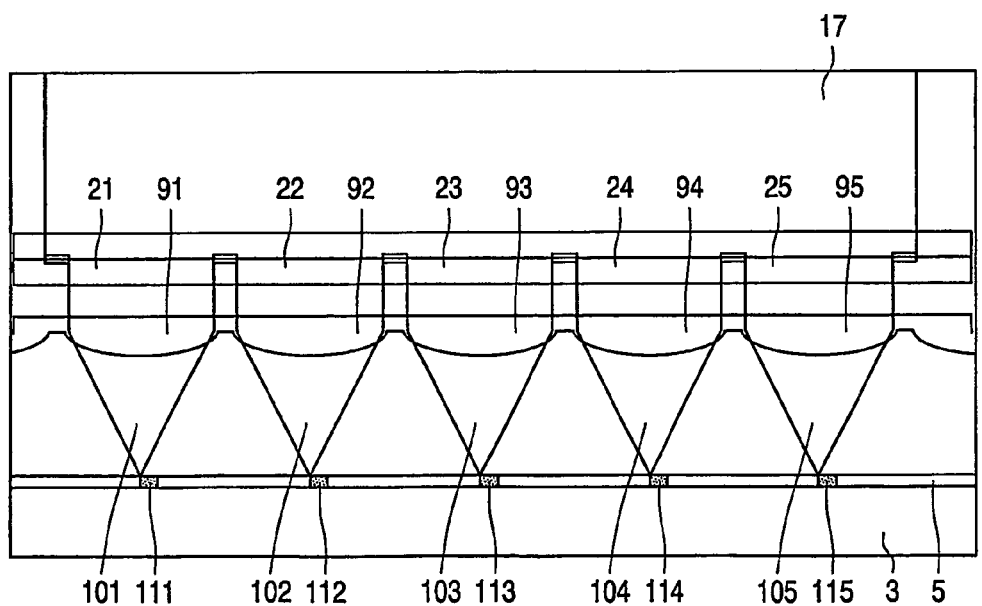
Figure 6B:
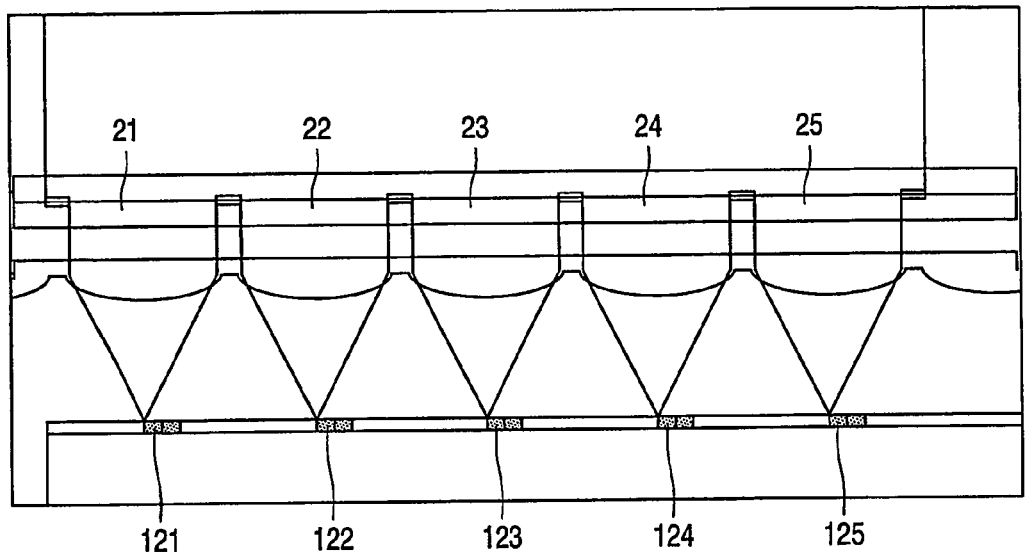
Figure 6C:
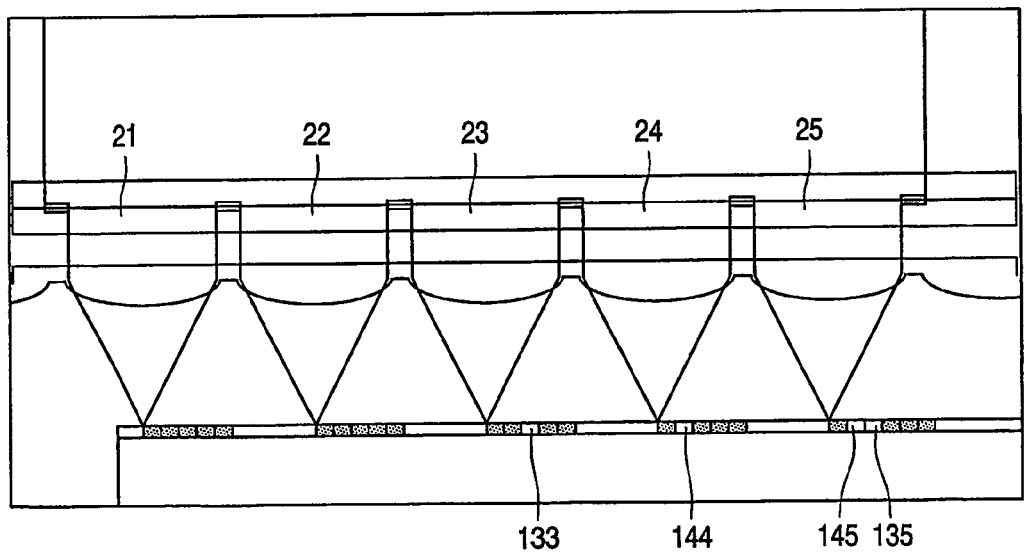
Figure 7A:
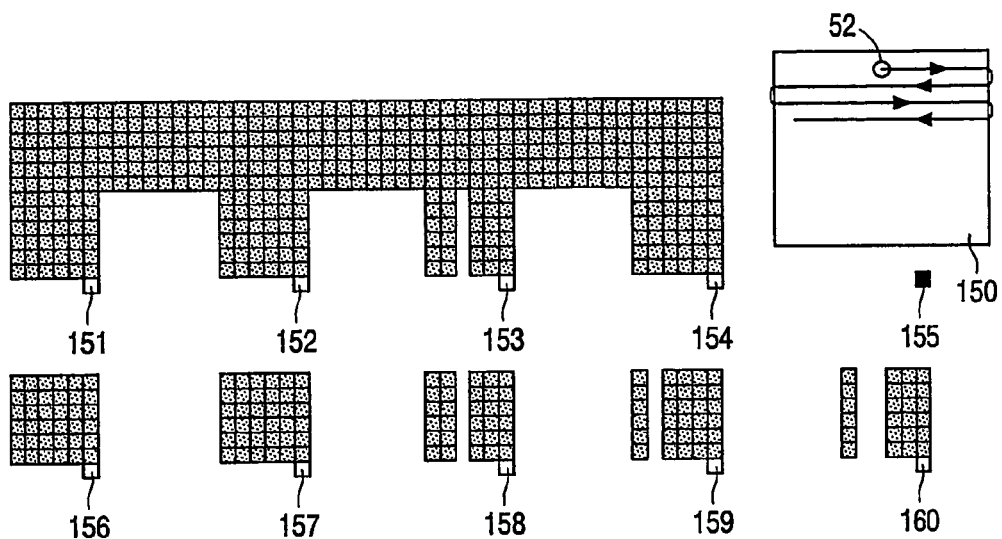
Figure 7B:
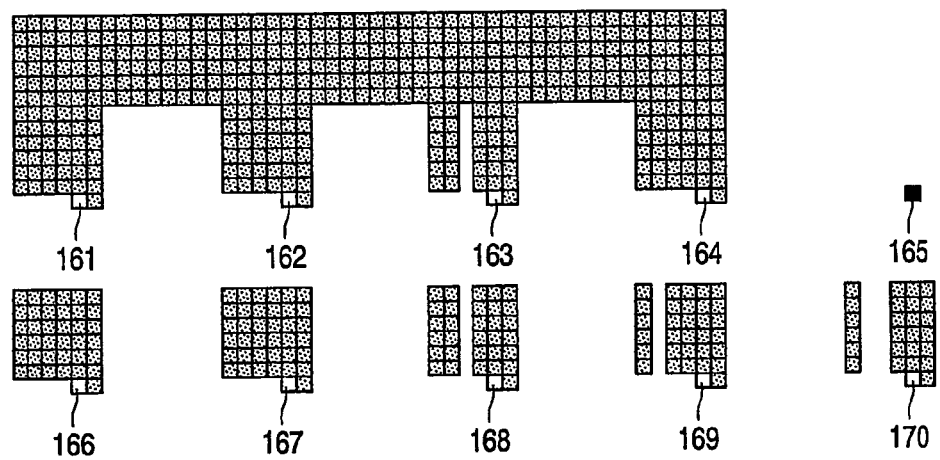
Figure 7C:
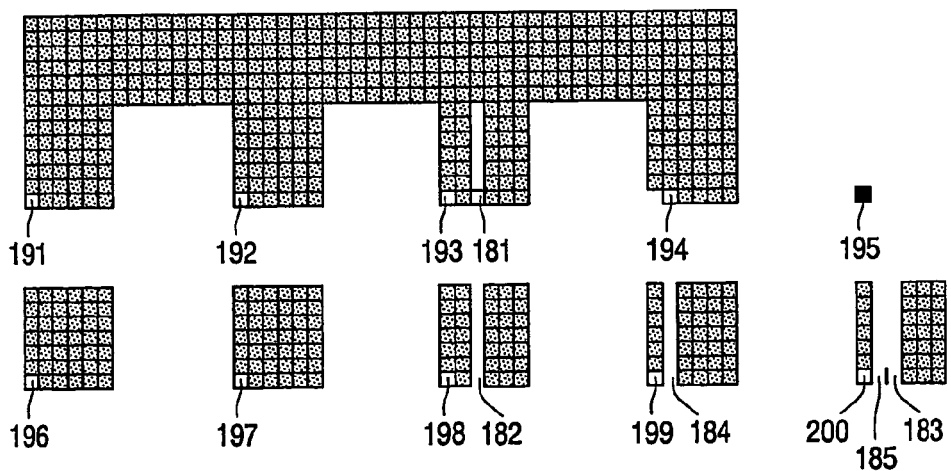
Figure 8:
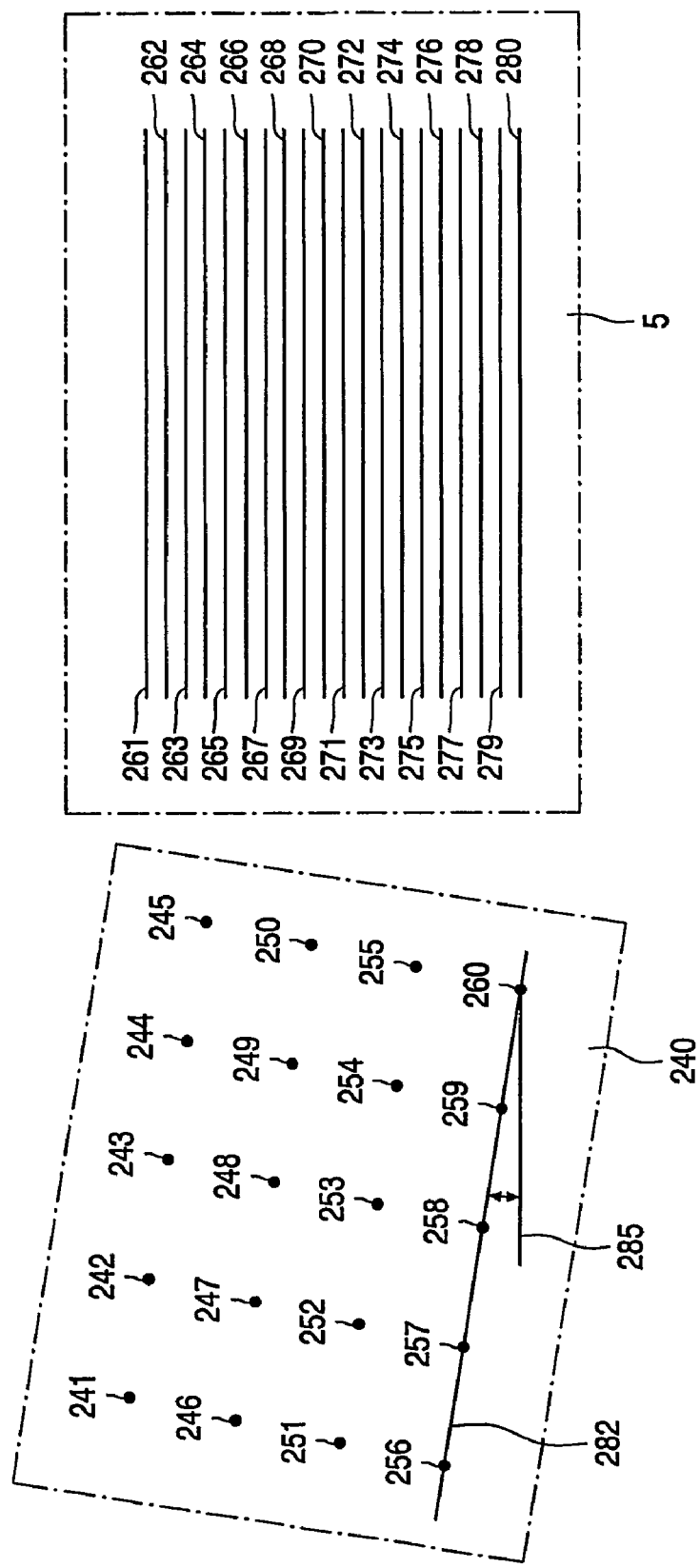
Figure 9A:
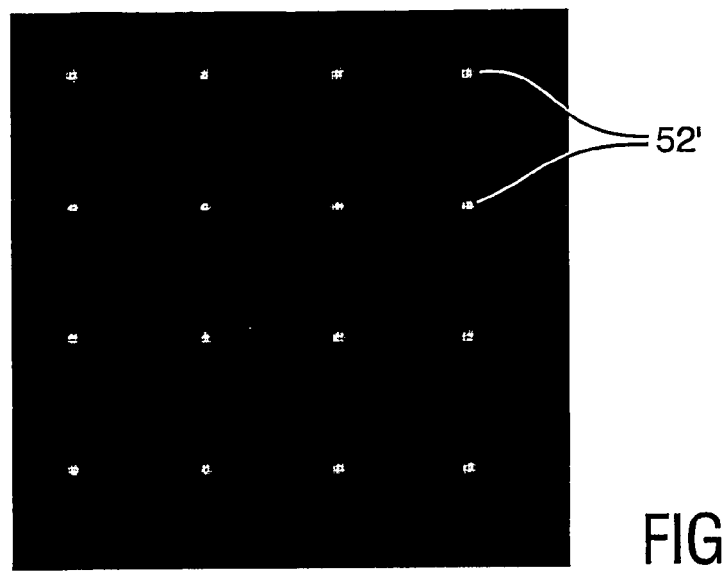
Figure 9B:
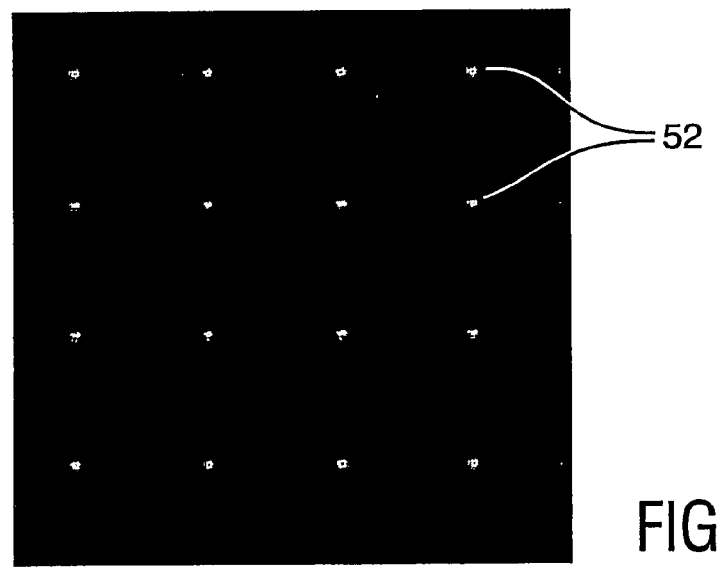
Figure 9C:
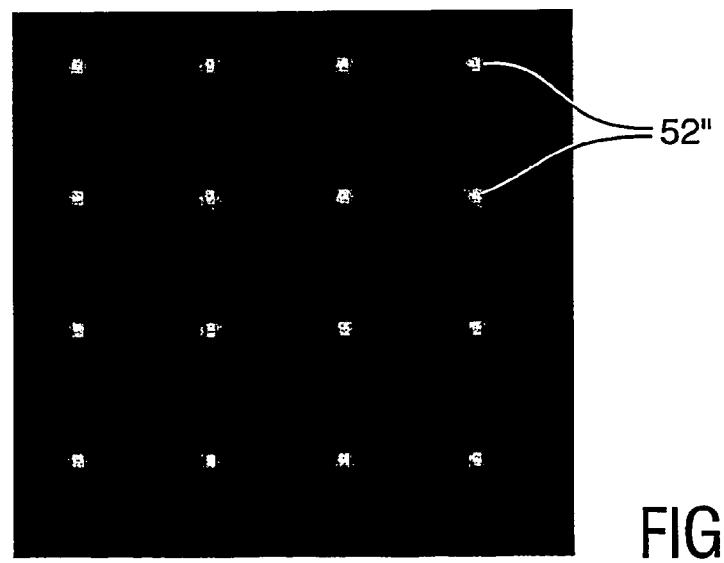
Figure 10:
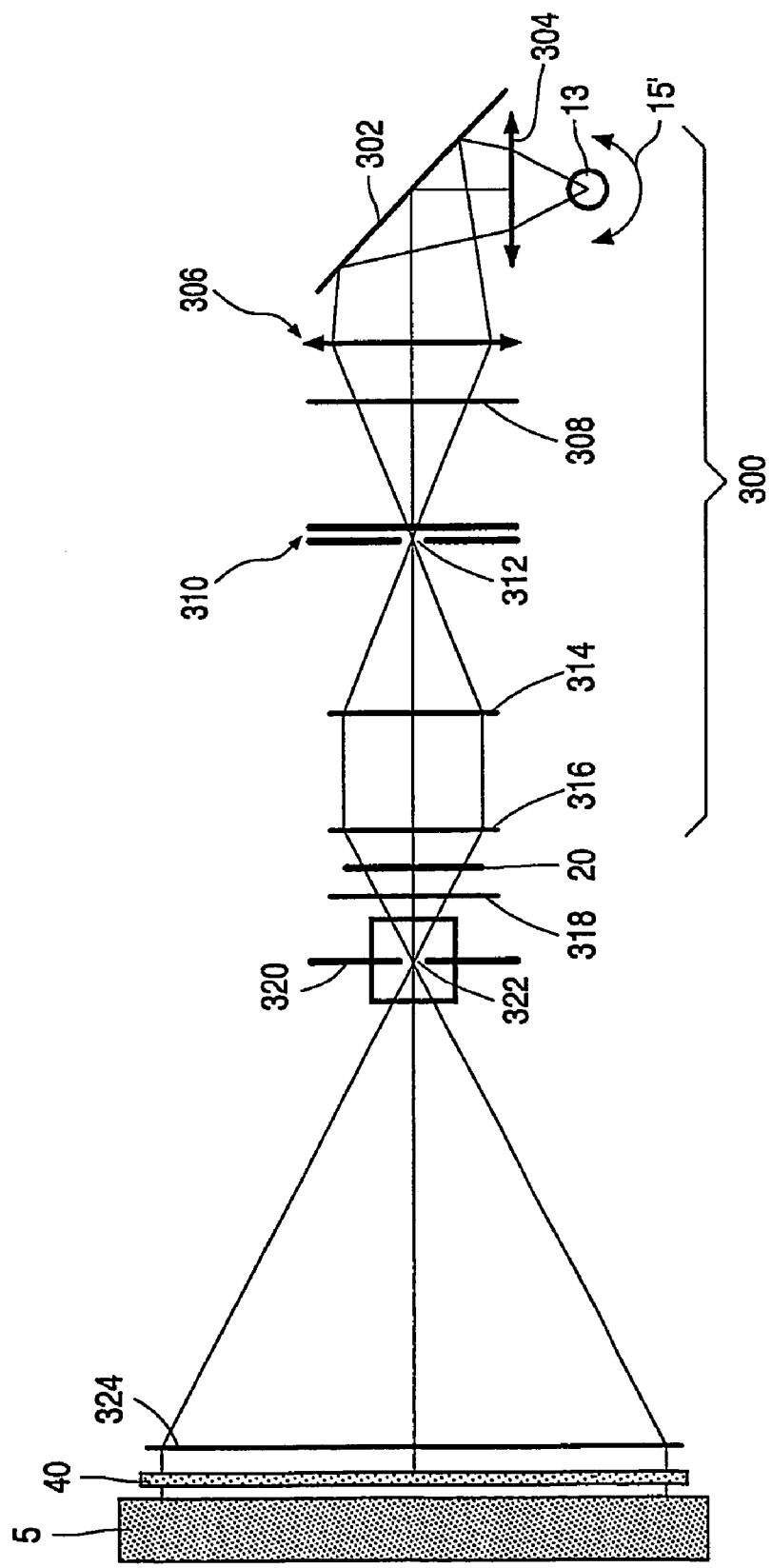
Figure 11:
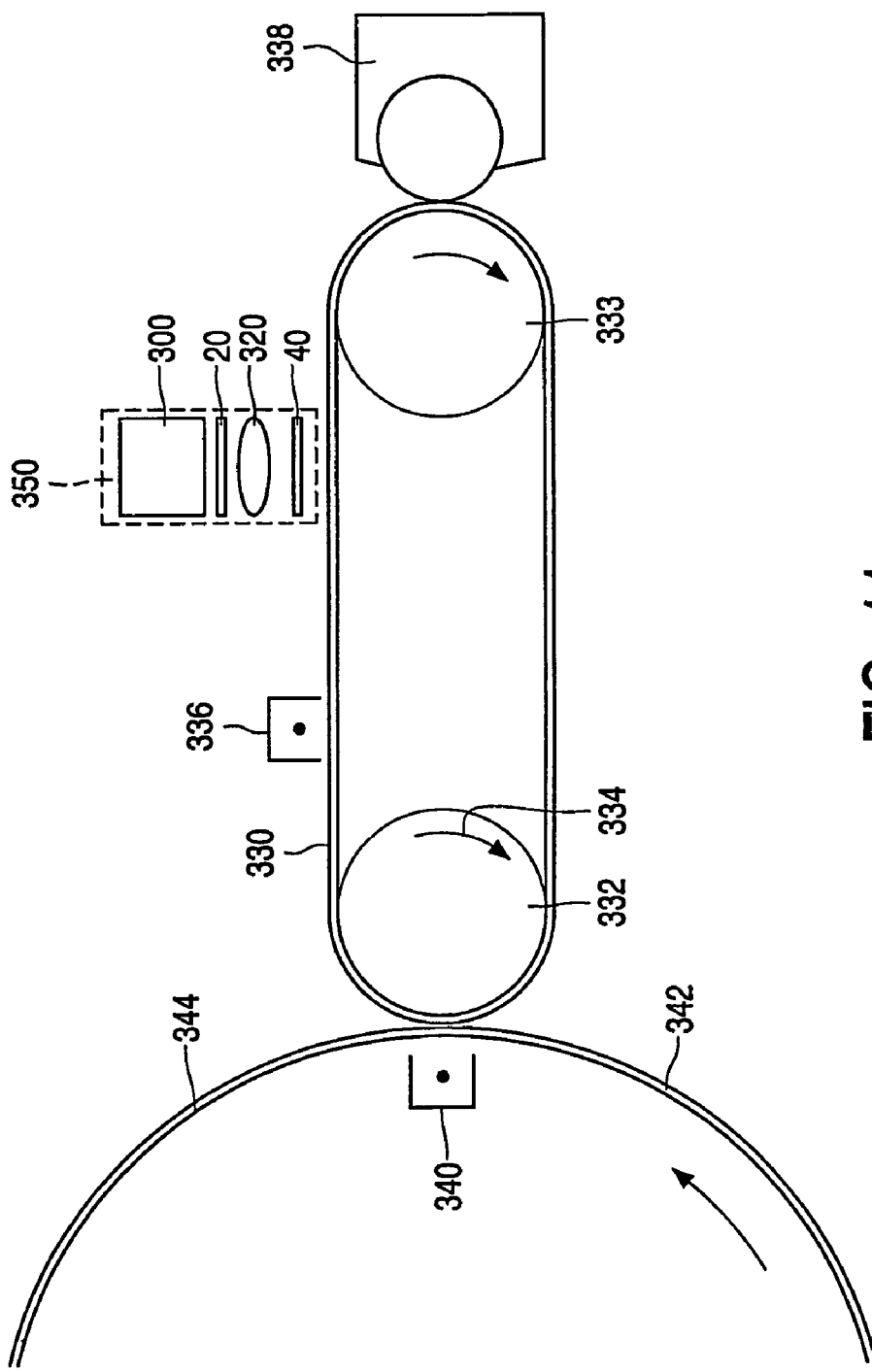

In the drawings:
FIG. 1 shows schematically a conventional proximity printing apparatus;
FIG. 2 shows an embodiment of an imaging apparatus according to the invention;
FIG. 3a is a top view of a portion of a refractive lens array used in this embodiment;
FIG. 3b is a top view of a portion of a light valve array used in this embodiment;
FIG. 3c is a top view of a portion of the array of spots formed in the resist layer by means of this embodiment;
FIG. 4 shows a first method of producing the lens array;
FIG. 5 shows an embodiment of an apparatus for producing a mould, which is used for manufacturing the lens array by replication;
FIGS. 6a–6c show, in a cross-sectional view, different moments of the printing process;
FIGS. 7a–7c show, in a top view, different moments of the printing process;
FIG. 8 shows the principle of skew scanning of an array of spots and a resist layer relative to each other;
FIGS. 9a–9c show an array of spots formed with different widths of the gap between the lens array and the resist layer;
FIG. 10 shows an embodiment of the imaging apparatus including a projection lens between the array of light valves and the lens array, and
FIG. 11 shows an embodiment of a printing apparatus wherein the invention can be used.

FIG. 1 shows, very schematically, a conventional proximity printing apparatus for the manufacture of, for example a LCD device. This apparatus comprises a substrate holder 1 for carrying a substrate 3 on which the device is to be manufactured. The substrate is coated with a radiation-sensitive, or resist, layer 5 in which an image, having features corresponding to the device features, is to be formed. The image information is contained in a mask 8 arranged in a mask holder 7. The mask comprises a transparent substrate 9, the lower surface of which is provided with a pattern 10 of transparent and non-transparent strips and areas, which represent the image information. A small air gap 11 having a gap width w of the order of 100 μm separates the pattern 10 from the resist layer 5. The apparatus further comprises a radiation source 12. This source may comprise a lamp 13, for example, a mercury arc lamp, and a reflector 15. This reflector reflects lamp radiation, which is emitted in backward and sideways directions towards the mask. The reflector may be a parabolic reflector and the lamp may be positioned in a focal point of the reflector, so that the radiation beam 17 from the radiation source is substantially a collimated beam. Other or additional optical elements, like one or more lenses, may be arranged in the radiation source to ensure that the beam 17 is substantially collimated. This beam is rather broad and illuminates the whole mask pattern 10 which may have dimensions from 7.5×7.5 cm² to 40×40 cm². For example, illumination step has a duration of the order of 10 seconds. After the mask pattern has been imaged in the resist layer, this is processed in the well-known way, i.e. the layer is developed and etched, so that the optical image is transferred in a surface structure of the substrate layer being processed.

The apparatus of FIG. 1 has a relatively simple construction and is very suitable for imaging in one go a large area mask pattern in the resist layer. However, the photomask is an expensive component and the price of a device manufactured by means of such a mask can be kept reasonably low only if a large number of the same device is manufactured. Mask making is a specialized technology, which is in the hands of a relatively small number of mask manufacturing firms. The time a device manufacturer needs for developing and manufacturing a new device or for modifying an existing device is strongly dependent on delivery times set by the mask manufacturer. Especially in the development phase of a device, when redesigns of the mask are often needed, the mask is a capability-limiting element. This is also the case for low-volume, customer-specific devices.

Direct writing of a pattern in the resist layer, for example by an electron beam writer or a laser beam writer, could provide the required flexibility, but is not a real alternative because this process takes too much time.

FIG. 2 shows the principle of a maskless method and apparatus by means of which an arbitrary and easily changeable image pattern can be formed in a resist layer within a reasonable time. FIG. 2 shows very schematically and in a vertical cross-section a small portion of the means which are used for performing the method and form part of the apparatus. The apparatus comprises a substrate holder 1 for accommodating a substrate, which is coated with a resist layer 5. Reference numeral 20 denotes a light valve device, for example a liquid crystal display (LCD), which is currently used in a display apparatus for displaying information, either in direct-view or in projection. Device 20 comprises a large number of light valves, also called pixels (picture elements) of which only a few are shown in FIG. 2 and denoted by reference numerals 21 to 25. The light valve device is controlled by a computer configuration 30 (not on scale) wherein the pattern, which is to be configured in a substrate layer, is introduced in software. The computer thus determines, at any moment of the writing process and for every light valve, whether it is closed, i.e. blocks the portion of the illuminating beam 17 incident on this light valve, or is open, i.e. transmits this portion to the resist layer. An imaging element 40 is arranged between the array of light valves 20 and the resist layer 5. This element comprises a transparent substrate 41 and an array 42 of radiation-converging elements 43. The number of these elements corresponds to the number of light valves, and the array 42 is aligned with the array of light valves so that each converging element belongs to a different one of the light valves.

As the radiation source, the substrate holder and the mask holder are less relevant for understanding the new method, these elements will not be described in detail.

According to the invention, the converging elements 43 are refractive lenses. Such lenses allow focusing of radiation from corresponding light valves in spots, which are smaller than those obtained with diffraction lenses. Moreover the optical performance of these lenses is substantially less dependent on the wavelength of the radiation than that of a diffraction lens element.

FIGS. 3a and 3b are top views of a portion of the array 42 of refractive microlenses 43 and the corresponding portion of the array 20 of light valves 21 to 25 and further light valves 27. The array 42 includes a number of cells 45 each comprising a central transmission portion 43, shaped as a microlens, and a surrounding border portion 47. The border portion of a cell blends with the border portion of the neighboring cells, thereby constituting a black matrix. Such a black matrix reduces crosstalk between the beam portions passing through the individual lenses. The border portions of all cells may be constituted by a radiation-absorbing or reflecting layer. The size of the spots formed in the resist layer and the depth of focus of the beam portions forming these spots is determined by the power of the lenses 43. By means of a spot-shaping aperture (not shown) arranged in the radiation source unit or illumination system supplying the illumination beam 17, the shape of the produced spots can be adapted to a required application. These spots may be, for example, round, rectangular, square or diamond-shaped. The geometric structure of the lens array 42 of the imaging element 40 is adapted to the geometric structure of the light valve array. The imaging element 40 is arranged at a distance from the array, such that as much as possible of the radiation from a light valve passes through an associated lens 43 and is concentrated in the spot produced by this lens and a minimum amount of background radiation occurs.

FIG. 3c shows an array 50 of spots 52 obtained by means of the lens array of FIG. 3a, if the corresponding portion of the light valve array is illuminated with radiation having a wavelength of, for example 365 nm and all light valves of the portion are open. The distance 44 between the diffraction structure 42 and the resist layer 5 is, for example, 250 μm. Spots 52 have a size of, for example, of the order of 2 μm².

The microlenses 43 are usually spherical lenses, i.e. their curved surface is a portion of a perfect sphere. If necessary, aspherical lenses may be used. An aspherical lens is understood to mean a lens, whose basic surface is spherical, but whose actual surface deviates from spherical in order to correct for spherical aberrations which a spherical lens may produce.

The spots 52 shown in FIG. 3c are rectangular spots. As mentioned hereinbefore, these spots may also be round or square or may have any other shape, which is deemed appropriate.

The array of refractive micro lenses, i.e. the imaging element 40, may be manufactured by means of techniques known per se. A first, lithographic, technique is shown in FIGS. 4a–4e. This technique starts from a transparent, for example a quartz, substrate 60, which is coated with a, for example polymer, resist layer 61, as shown in FIG. 4a. By means of radiation 63 an exposure pattern corresponding to the pattern of micro lenses is formed in the resist layer 61, as illustrated in FIG. 4b. The exposure pattern consists of a two dimensional array of cylindrical exposed resist portions 65. The exposure may be performed, by example, by optical radiation of different kinds or by a charged particle (electron or ion) beam. After the resist has been developed and the non-exposed portions removed, a configuration of cylindrical resist portions 65 on top of the substrate 60 remains, as shown in FIG. 4c. As a next step, this configuration is heated, for example to 200° C. dependent on the kind of resist used, which causes flowing of the resist material, such that the cylinders 65 are reshaped to spherical segments 67, as shown in FIG. 4d. By reactive ion etching the pattern of resist segments 67 is then transferred to a similar pattern of spherical segments 69 at the upper side of the substrates, as shown in FIG. 4e. In this way a lens plate 70 is obtained, whereby the geometry of a micro lens 69 and the difference between the index of refraction of this lens and that of the ambient medium determine its optical power. Finally, as shown in FIG. 4f, the substrate surface areas between the micro lenses are coated with an absorbing or reflective layer 73, such as a chromium layer.

By changing, during the etching process, the ratio of the etching rate of the resist and of the substrate, i.e, changing the selectivity of the etching process, this method allows production of aspherical microlenses.

A second method of manufacturing a microlens plate for use with the new method uses a replication-from-a-mould technique.

FIG. 5 schematically shows an apparatus that is preferably used for manufacturing a mould suitable for this replication technique. The apparatus comprises a workpiece holder 76 on which a mould 75 to be manufactured can be placed and fastened by clamping means (not shown). The holder with the mould can be accurately moved and positioned by means of X and Y-slides (not shown). The apparatus further comprises a tool holder 77, which is fastened to a Z-slide 78. The holder 77 is provided with a circular-cylindrical stepped chamber 79 comprising a first chamber portion 80 and a second chamber portion 81, which has a smaller diameter than the first chamber portion 80. The second chamber portion 81 constitutes a straight guide for a round shaft 82 of a die holder 83, which is guided with sliding possibility parallel to the Z-direction relative to the second chamber portion 81 and is provided with an end disc 84. The end disc bears on a stop 85, formed by a shoulder of the stepped chamber 79, under the influence of a previously defined pre-tensioning force of a mechanical helical spring 85 arranged in the first chamber portion. As FIG. 5 shows, a die 86 is fastened to the holder 83, which die has a smooth surface 87 and is manufactured from, for example, a hard steel or sapphire. The tool holder 77 and the die holder 83 are jointly displaceable relative to the workpiece holder 76 in directions parallel to the X-direction, Y-direction and Z-direction.

The mould 75 is manufactured from a ductile metal such as, for example, copper, aluminum, zinc or an alloy comprising these metals. The surface 88 of the mould 75 has been given a surface smoothness of optical quality desired for the lens plate or imaging element 40 to be manufactured. The shape of the surface 87 of the die corresponds to that of one lens 43 of the lens plate 40.

FIG. 5 represents the situation after the die has been pressed several times into the mould 75 and several imprints 89 have been made. To form the next imprint, the die 86 is displaced to the next position through a displacement of the X-slide and/or Y-slide, during which the holder 83 rests against the stop 85 of the chamber 79. Then, the die is pressed into the mould 75 through a displacement of the Z-slide 78. The end disc 84 of the die holder 83 then clears the stop 85, so that the die is imprinted in the mould 75 with a force which corresponds to the predetermined pre-tensioning force of the mechanical helical spring 85. It is achieved through a favorable choice of the pre-tensioning force and of the elasticity modulus of the helical spring 85 that the increase of the pre-tensioning force of the spring upon clearance of the end disc 84 is negligibly small. The force with which the die 86 is imprinted in the mould 75 is thus substantially independent of the position occupied by the Z-slide 78 and the tool holder 77 parallel to the Z-direction during imprinting. No stringent requirements need accordingly be imposed on the positioning accuracy of the Z-slide 78.

While the die 86 is being imprinted in the mould 75, the ductile metal of the mould present below the die surface 87 is plastically deformed. The metal at this position assumes a shape corresponding to that of the die surface 87, i.e. to that of a lens 43 of the lens plate 40. The complete mould shape is formed by successively imprinting the die surface shape at all required positions in the mould.

For more details about the method of and apparatus for manufacturing the mould, reference is made to WO 96/07523, which discloses said method and apparatus for other applications.

After the mould has been finished, it can be positioned in a replication apparatus. The mould is covered with a transparent material in a sufficiently viscous state, for example a liquid polymer, such that it fills up the imprints 89. After the transparent material has been hardened, for example by UV radiation, whereby the surface profile of the mould is transferred to transparent material, the plate of transparent material can be removed from the mould and the lens plate is obtained.

By giving the die surface 87 an aspherical shape, a lens plate with aspherical microlenses can be produced.

Instead of chromium, other non-transmission materials can be used for the selective coating of the lens plate.

As shown in FIG. 3c, each spot 52 occupies only a small, point-like portion of the resist layer area belonging to the light valve, which determines whether this spot is present or not. Hereinafter, the point-like resist areas will be called spot areas and the resist area belonging to a light valve will be called valve area. To obtain full features, i.e. lines and areas, of the image pattern corresponding to the device features to be produced, the substrate with the resist layer, on the one hand, and the two arrays, on the other hand, should be displaced relative to each other. In other words, each spot should be moved in its corresponding valve area such that this area is fully scanned and illuminated at prescribed, i.e. feature-determined, positions. Most practically, this is realized by displacing the substrate stepwise in a gridlike pattern. The displacement steps are of the order of the size of the spots, for example of the order of 1 µm or smaller. A portion of the valve area belonging to a given spot, which portion is destined for an image feature or part thereof, is illuminated in flashes. For displacing the substrate holder in steps of 1 µm or smaller with the required accuracy, use can be made of servocontrolled substrate stages, which are used in lithographic projection apparatus and operate with an accuracy of well below 1 µm, for example of the order of 10 nm.

The illumination process of flashing and stepping is illustrated in FIGS. 6a–6c, which show a small portion of the array of light valves, the array of refractive lenses arid the resist layer. In these Figures, the reference numeral 17 denotes the illuminating beam incident on the light valves 21–25. Reference numerals 101 to 105 denote the sub-beams passed by open light valves and converged by the corresponding refractive lenses 91 to 95. FIG. 6a presents the situation after a first sub-illumination has been made with all light valves open. A first set of spot areas 111 to 115, one spot area in each light valve area has been illuminated.

FIG. 6b presents the situation after the substrate has made one step to the right and a second sub-illumination has been made also with all light valves open so that a second set of spot areas 121 to 125 has been illuminated. FIG. 6c presents the situation after the substrate has made five steps and six sub-illuminations have been made. During the fourth sub-illumination light valves 23 and 25 were closed so that spot areas 133 and 135 have not been illuminated. During the fifth sub-illumination, the light valves 24 and 25 were closed so that spot areas 144 and 145 have not been illuminated. All other spot areas have been illuminated.

FIGS. 7a–7c are top views of the resist layer during subsequent sub-illumination steps. In these Figures, the grey spot areas have already been illuminated in preceding sub-illumination steps and the blank spot areas, i.e. areas 151 to 154 and 156 to 160 in FIG. 7a, are being illuminated in the present illumination step. The portion of the resist layer being illuminated comprises two rows of five light valve areas. In the situation depicted in FIG. 7a, a relatively large number of spot areas of the upper row and a lower number of spot areas in the lower row have already been illuminated. During a first sub illumination step four of the five light valves belonging to the upper row of light valve areas are open and the fifth, the most right one, is closed so that spot areas 151 to 154 are momentarily illuminated and spot area 155 is not. All of the five light valves belonging to the lower row of light valve areas are open so that spot areas 156 to 160 are momentarily illuminated. FIG. 7b shows the situation after the substrate has made one step and a second sub-illumination is being carried out. Again, four of the five light valves of the upper row are open and the fifth light valve of this row is closed so that spot areas 161 to 164 are momentarily illuminated and spot area 165 is not. All of the five light valves of the lower row are open so that spot areas 166 to 170 are momentarily illuminated. FIG. 7c shows the situation during the sixth sub-illumination, i.e. after the substrate has made five steps. During the six sub-illumination, the fifth light valve of the upper row was (is) closed. During the fourth sub-illumination the third light valve of the upper row and the third and fifth light valves of the lower row were closed so that spot areas 181, 182 and 183 have not been illuminated. During the fifth sub-illumination, the fourth and fifth light valves of the lower row were closed so that spot areas 184 and 185 have not been illuminated. During the sixth sub-illumination, all light valves, except the fifth one of the upper row are open so that all spot areas 191 to 200 are momentarily illuminated, except spot area 195.

FIGS. 6a–6c and 7a–7c show how the required image patterns are produced in ten light valve areas simultaneously by the successive steps of displacing the resist layer and opening and closing the ten corresponding light valves. Opening and closing of each light valve is controlled individually. As shown in the upper right portion of FIG. 7a, scanning of a valve area 150 with a spot 52 can be performed serpentine-wise. A first line of the area is scanned from left to right, a second line from right to left, a third line from left to right again, etc.

Instead of the stepping mode, illustrated in FIGS. 6a–6c and FIGS. 7a–7c, also a scanning mode can be used to produce the required image patterns. In the scanning mode the resist layer, on the one hand, and the arrays of light valves and refractive lenses, on the other hand, are continuously moved with respect to each other, and the light valves are flashed when they face a prescribed position on the resist layer. The flash time, i.e. the open-time of the light valve, should be smaller than the time during which the relevant light valve faces said position.

In a practical embodiment of the proximity printing apparatus shown in FIG. 2, the several parameters have the following values:

| | |
|---|---|
| Illuminated field: | 10 × 10 mm$^2$; |
| Radiation source: | Mercury-arc lamp; |
| Intensity of the illumination beam: | 20 mW/cm$^2$; |
| Beam collimating angle: | 0.2 degrees; |
| Transmission of the light valves: | 25%; |
| Shutter speed of the light valves: | 1 ms.; |
| Spot area in the resist layer: | 1 × 1 μm$^2$; |
| Spot-to-spot distance: | 100 μm; |
| Number of light valves; | 1,000,000; |
| Intensity of the spots: | 50 W/cm$^2$; |
| Exposure dose; | 100 mJ/cm$^2$; |
| Total exposure time: | 20 sec.; |
| Gap width: | 250 μm; |
| Scan speed: | 0.5 mm/sec. |

The exposure dose is the amount of illumination radiation energy deposited in a spot area of the resist. The intensity of the illumination beam and the opening time of the light valve determine this dose. For a mercury discharge lamp, it holds that 40% of the radiation emitted by this lamp has a wavelength of 365 nm, 20% of this radiation has a wavelength of 405 nm and 40% of this radiation has a wavelength of 436 nm. The effective contribution to the image formation of this lamp radiation is 60% by the 365 nm component, 15% by the 405 nm component and 25% by the 436 nm component, due to the absorption in the resist layer.

The invention can also be implemented with other radiation sources, preferably lasers, especially lasers used currently or to be used in the near future in wafer steppers and wafer-step-and scanners, emitting radiation at wavelengths of 248, 193 and 157 nm, respectively. Lasers provide the advantage that they emit a beam, which has a single wavelength and is collimated to the required degree. Essential for the present imaging method is that the illumination beam is substantially a collimated beam. The best results are obtained with a fully collimated beam, i.e. a beam having an aperture angle of 0°. However satisfactory results can also be obtained with a beam having an aperture angle which is smaller than 1°.

The required movement, with respect to each other, of the resist layer, on the one hand, and the array of light valves and the array of microlenses, on the other hand, is most practically performed by movement of the substrate stage. Substrate stages currently used in wafer steppers are very suitable for this purpose, because they are more than accurate enough. It will be clear that movement of the substrate stage, for either the stepping mode or the scanning mode, should be synchronized with switching of the light valve. To that end, the computer 30 of FIG. 2, which controls the light valve array, may also control the movement of the stage.

An image pattern larger than the illumination field of one array of light valves and one array of refractive lenses can be produced by dividing, in the software, such a pattern into sub-patterns and successively transferring the sub-patterns to neighboring resist areas having the size of the image field. By using an accurate substrate stage, the sub-image patterns can be put together precisely so that one non-interrupted large image is obtained.

A large image pattern can also be produced by using a composed light valve array and a composed refractive lens array. The composed light valve array comprises, for example, five LCDs, each having 1000×1000 light valves. The LCDs are arranged in a series to cover, for example, the width of the image pattern to be produced. The composed refractive lens array is constructed in a corresponding way to fit to the composed light valve array. The image pattern is produced by first scanning and illuminating a resist area having a length covered by a single array of light valves and a width covered by the series of light valve arrays. Subsequently, the substrate with the resist layer and the series of arrays are displaced relative to each other in the longitudinal direction over a distance covered by a single array. Then a second resist area, which now faces the composed arrays is scanned and illuminated, etc. until the whole image pattern has been produced.

In the embodiment of the method described above, a spot formed by a light valve is stepped or scanned in two dimensions across the valve area belonging to this spot to write this area. This is no longer the case in an alternative embodiment of the method. According to this embodiment, each spot is used to write a resist area, which in one direction has a dimension which is considerably larger than that of said valve area, whilst a number of spots are used to write said resist area in the other direction. The principle of said alternative method is shown in FIG. 8. The left-hand part of FIG. 8 shows a small portion 240 of a matrix of spots. This portion comprises four rows of five spots each 241 to 245, 246 to 250, 251 to 255 and 256 to 260, respectively. The right-hand part of FIG. 9 shows the portion of the resist layer 5, which can be written, by the spots 241 to 260. The direction 282 of the lines of spots is now at a small angle γ with respect to the direction 285 along which the spots and the resist layer are moved relative to each other. This angle is chosen to be such that the spots of one line of spots when projected upon the Y-axis fit within the Y-interspace between this line of spots and the next line of spots and fill up this interspace. When the substrate is scanned in the X direction, each spot scans its own line across the resist layer over a length which is equal to the length of the image field of the light valve array and refractive lens array assembly. The lines 261 to 265 in the right-hand part of FIG. 8 are the center lines of the small, for example 1 μm wide, strips scanned by the spots 241 to 245, respectively. Spots 246 to 250 scan lines 266 to 270, respectively, and so on.

For a matrix of 100×100 spots each having a dimension of 1×1 μm$^2$, which matrix covers an image field of 10×10 mm$^2$, the spot period is 100 μm in the X and Y-directions. In order to achieve that one hundred scans of one row scan one hundred successive lines in the resist layer, the angle γ between the scan direction and the direction of lines of the spots should be: γ=arctan(1/100)=0,57°. By scanning each spot in the X-direction over 10 mm, the whole field of 10×10 mm$^2$ can be written, without moving the spots and the resist layer relative to each other in the Y-direction. Due to run-in and run-out of the spots, the total scanning distance is larger, for example 20 mm, than the effective scanning distance of 10 mm, for example 20 mm. The scanning distance needed for run-in and run-out is dependent on said angle γ. For a larger matrix of spots, for example 1000×1000 spots, the ratio of effective scanning distance and total scanning distance is considerably increased.

By decreasing the distance between the spots, the centers of the strips written by the spots can be decreased and the density of the written pattern can be increased. This allows imparting redundancy to the system and avoiding that a spot failure results in a hard error.

Skew scanning may also be used in a system for imaging a large pattern and comprising a composed light valve array and a corresponding composed refractive lens array. For example, with a system comprising five LCD arrays arranged in series in the Y-direction and each producing, within an image field of 100×100 mm$^2$, 1000×1000 spots with lines of spots at the above-mentioned angle of 0.57°, a resist area of 500×100 mm$^2$ can be written by scanning the resist layer 10 mm in the X-direction. After the resist layer has been moved 90 mm in the X-direction, the same scan can be repeated. In this way, a resist area of 500×1000 mm$^2$ can be written by scanning and moving ten times in the X-direction only.

The number of scans and intermediate movements needed for writing a given area depends on the number of light valves, and thus the number of spots, in the X and Y-directions. For example, with an array of 5000×100 spots, a resist area of 500 mm in the Y-direction can be written by continuously scanning in the X-direction without intermediate movement. The scan length determines the length in the X-direction of the written area.

An essential parameter for the imaging process is the gap width 44 (FIG. 2). Gap width is one of the input parameters for computing the required power of the refractive lenses and is determined by the required image resolution. If a refractive lens array is computed and manufactured for a given gap width and resolution, this resolution can only be obtained for the given gap width. If, in real circumstances, the gap width deviates from said given gap width, the required resolution cannot be achieved. This can be demonstrated, on an analogy base, with reference to FIGS. 9a, 9b and 9c, which have been copied from a co-pending patent application. The latter application relates to a maskless lithography apparatus wherein an array of specific diffraction lenses, instead of refractive lenses, is used to focus sub-beams from the light valves to spots in the resist layer. FIGS. 9a, 9b and 9c show the spots formed in the resist layer by means of the same array of microlenses, designed for a gap width of 50 μm, and under the same illumination conditions, but with different gap widths. FIG. 9a shows a pattern 210 of spots 52', which are obtained when the gap width is 40 μm. FIG. 9b shows a pattern 220 of spots 52 obtained with a gap width of 50 μm and FIG. 8c shows a pattern 230 of spots 52" obtained with a gap width of 60 μM. Only the spots of FIG. 9b obtained with a gap width which is equal to the design gap width have the required sharpness and intensity. The performance of a maskless lithographic apparatus, which uses refractive lenses, shows a similar dependence on the gap width.

For an apparatus with a larger design gap width of, for example 250 μm, the requirements for the real gap width can be lessened. With an increasing design gap width the NA of the sub-beams (101 to 105 in FIG. 6a) from the refractive lenses decreases. As the depth of focus is proportional to the inverse of the squared NA, the depth of focus increases with an increasing design gap width. This means that, for larger design gap widths, larger gap width variations are tolerable than for smaller design gap widths. From a tolerances point of view, a larger gap width of, for example 250 μm, is preferred to a smaller gap width of, for example 50 μm.

The minimum size of the spots is also related to the gap width. If the gap width is reduced, this size can be decreased, for example below 1 nm. A smaller gap width, and thus a smaller spot size, requires a better control of this width.

The present method is suitable for the manufacture of a device composed of sub-devices, which are positioned at different levels. Such a device may be a purely electronic device or a device that comprises two or more different kinds of features from a diversity of electrical, mechanical or optical systems. An example of such a system is a micro-optical-electrical-mechanical system, known as MOEMS. A more specific example is a device comprising a diode laser or a detector and a light guide and possibly lens means to couple light from the laser into the light guide or from the light guide into the detector. The lens means may be planar diffraction means. For the manufacture of a multilevel device, a substrate is used that has a resist layer deposited on different levels.

In principle, a multiple level device could be manufactured by means of an apparatus having a microlens array, which comprises collections of refractive lenses, which collections differ from each other in that the focal plane of the refractive lenses of each collection is different from that of the other collections. Such an apparatus allows simultaneous printing in different planes of the substrate.

A more practical, and thus preferred method of producing multiple-level devices is to divide software-wise the total image pattern into a number of sub-images each belonging to a different level of the device to be produced. In a first sub-imaging process, a first sub-image is produced, wherein the resist layer is positioned at a first level. The first sub-imaging process is performed according to the, scanning or stepping, method and by the means described hereinbefore. Then the resist layer is positioned at a second level, and in a second sub-imaging process, the sub-image belonging to the second level is produced. The shifting of the resist layer in the Z-direction and the sub-imaging processes are repeated until all sub-images of the multiple-level device are transferred to the resist layer.

The method of the invention can be carried out with a robust apparatus that is, moreover, quite simple as compared with a stepper or step-and-scan lithographic projection apparatus.

In the apparatus, schematically shown in FIG. 2, the array of light valves 21 to 25, i.e. a LCD, is arranged as close as possible to the imaging element, or lens plate, 40 comprising the refractive lenses 43. The size of the light valves, or pixels, of this LCD may be relatively large, for example 100×100 µm². In a LCD device, a polarization analyzer, also called analyzer, is needed to convert polarization states, introduced by the light valves, into intensity levels. If a commercially available LCD panel, currently applied in video projectors working with visible light, is used, the visible light analyzer should be removed from the panel and a separate UV or DUV analyzer should be arranged between the light valves and the imaging element 40. Moreover the substrate 41 of this element has some thickness. As a consequence, there is some distance between the light valves and the lenses of the imaging element. This distance should be taken into account when designing the apparatus in order to prevent that a non sharp image of the light valves is formed in the resist layer and that crosstalk occurs between radiation from different light valves due to said distance and diffraction effects.

To reduce the distance between the light valves and the refractive lenses and to prevent annoying crosstalk, the array of refractive lenses may be arranged on the lower surface of the polarizer and/or the polarizer may be arranged on the light valve structure.

FIG. 10 shows an alternative embodiment of the apparatus, which is attractive in view of the above remarks. This apparatus comprises a projection lens, which images the array of light valves on the array of refractive lenses, whereby each light valve is conjugated with a corresponding refractive lens. The use of a projection lens allows more freedom of design than allowed in the sandwich design of the FIG. 2 apparatus.

The left part of FIG. 10 shows an illumination system 300, which may also be used in the apparatus of FIG. 2. This illumination system comprises a radiation source, for example a mercury lamp 13 and a reflector 15, which may have the shape of a half sphere. The reflector may be arranged with respect to the lamp such that no central obstruction of the illumination beam occurs. A laser may replace lamp 13 and reflector 15. The beam from the radiation source 13,15 is incident on a wavelength selective reflector, or dichroic mirror, 302, which reflects only the beam component with the required wavelength, for example UV or DUV radiation, and removes radiation of other wavelengths, such as IR or visible radiation. If the radiation source is a laser, no selective reflector is needed and either a neutral reflector can be arranged at the position of the reflector 302 or the laser can be arranged in line with the rest of the optical path. A first condenser lens system, for example comprising a first condenser lens 304 and a second condenser lens 306 arranged before and after the reflector 302, respectively, converges the illumination beam 17 on a radiation shutter 310. This shutter is provided with a diaphragm 312. The shape of this diaphragm determines the shape of the spots formed in the resist layer 5 and this diaphragm thus constitutes the spot-shaping aperture mentioned hereinbefore. A second condenser system, for example comprising condenser lenses 314,316 concentrates the radiation passed by diaphragm 312 in the pupil 322, or diaphragm, of a projection lens 320, i.e. it images diaphragm 312 in the plane of the pupil of the projection lens 320. The beam passing condenser lens 316 illuminates LCD 20, which is arranged between condenser lens 316 and projection lens 320. This lens images the LCD on imaging element 40, described herein before, such that each light valve (pixel) of the LCD is conjugated with a corresponding refractive lens of the imaging element 40. If a light valve is open, the radiation from this valve is incident on the conjugated refractive lens only. The imaging element may be arranged at a distance of 600 mm from the LCD. The distance between the imaging element and the resist layer 5 may be of the order of 100 to 300 µm.

The LCD 20 may have a pixel size of 20 µm and the projection lens may image the LCD pixel structure on the imaging element with a magnification of 5×. For such imaging no large numerical aperture (NA) for the projection lens is required. To improve the collimation of the illumination beam incident on the imaging element, a collimator lens 324 may be arranged in front of the imaging element. The projection lens and a refractive lens together image the diaphragm opening into a spot. For example, a diaphragm opening of 1 mm is imaged in a spot with a dimension of 1 µm. As the operation of the LCD is based on changing the polarization state of incident radiation, a polarizer, which gives the radiation the required initial polarization state is needed. Also needed is a polarization analyzer, which converts the polarization state into an intensity. This polarizer and analyzer are denoted by reference numerals 308 and 318, respectively. The polarizer and the analyzer are adapted to the wavelength of the illumination beam. Although not shown in FIG. 2, a polarizer and an analyzer are also present in the apparatus according to this Figure.

As the image of the LCD pixel structure is focused on the imaging element 40 in an apparatus with a projection lens, practically no crosstalk will occur in such an apparatus. Moreover, the imaging element may comprise a thick substrate so that it is more stable. When an apparatus having a LCD light valve array is in use, the polarizer and the analyzer absorb radiation and produce heat. If the polarizer and analyzer are arranged close to the LCD, which is usually the case, this may cause thermal effects. An apparatus wherein a projection lens is arranged between the LCD and the imaging element allows arranging the analyzer 308 remote from the LCD. In this way it is prevented to a high degree that thermal effects will occur. As shown in FIG. 10, also the analyzer 318 may be arranged at some distance from the LCD 20. Moreover, the design of FIG. 10 allows separate cooling of the LCD. A LCD light valve array may comprise spacers in the form of small, for example 4 μm, spheres of a polymer material. Such spheres may cause optical disturbances. In an apparatus with a projection lens the effects of the spacers are reduced because the projection lens, which has a relatively small NA functions as a spatial filter for the high frequency disturbances.

When using a projection lens, it becomes easy to replace a transmission light valve array by a reflective array, such as a reflective LCD or a digital mirror device (DMD). An apparatus wherein a DMD is used should be provided with spatial filtering means. These means should ensure that only radiation having a predetermined direction, i.e. radiation which is reflected by mirrors having a predetermined orientation, reaches the imaging element 40 and the resist layer. A projection lens provides such a filtering function.

The apparatus of FIG. 10 is only one example of an apparatus with a projection lens. Many modifications of the FIG. 10 apparatus are possible.

In practice, the method of the invention will be applied as one step in a process for manufacturing a device having device features in at least one process layer of a substrate. After the image has been printed in the resist layer on top of the process layer, material is removed from, or added to, areas of the process layer, which areas are delineated by the printed image. These process steps of imaging and removing or adding material are repeated for all process layers until the whole device is finished. In those cases where sub-devices are to be formed at different levels and use can be made of multiple level substrates, sub-image patterns associated with the sub-devices can be imaged with different distances between the imaging element and the resist layer.

The invention can be used for printing patterns of, and thus for the manufacture of display devices like LCD, Plasma Display Panels and PolyLed Displays, printed circuit boards (PCB) and micro multiple function systems (MOEMS).

The invention cannot only be used in a lithographic proximity printing apparatus but also in other kinds of image-forming apparatus, such as a printing apparatus or a copier apparatus.

FIG. 11 shows an embodiment of a printer, which comprises an array of light valves and a corresponding array of refractive lenses according to the invention. The printer comprises a layer 330 of radiation-sensitive material, which serves as an image carrier. The layer 330 is transported by means of two drums, 332 and 333, which are rotated in the direction of arrow 334. Before arriving at the exposure unit 350, the radiation-sensitive material is uniformly charged by a charger 336. The exposure station 350 forms an electrostatic latent image in the material 330. The latent image is converted into a toner image in a developer 338 wherein supplied toner particles attach selectively to the material 330. In a transfer unit 340 the toner image in the material 330 is transferred to a transfer sheet 342, which is transported by a drum 344.

The invention claimed is:

1. A method of forming an optical image in a radiation sensitive layer, the method comprising:
    providing a radiation source;
    providing a radiation sensitive layer;
    positioning a two-dimensional array of individually controlled light valves between the radiation source and the radiation sensitive layer;
    positioning a two-dimensional array of radiation converging elements between the array of light valves and the radiation sensitive layer without any intervening imaging elements between the array of radiation converging elements and the array of light valves, wherein each of these radiation convergence elements corresponds to a different one of the light valves and serves to converge radiation from the corresponding light valve in a spot area in the radiation sensitive layer; and
    simultaneously writing image portions in radiation sensitive layer area by scanning said layer areas and the associated light valves/converging elements pairs relative to each other and switching each of the light valves between on and off states in dependency of the image portion to be written in by the light valve,
    characterized in that use is made of converging elements in the form of refractive lenses and in the two arrays are used for forming a matrix array of spots, said matrix having a pitch substantially larger than the spot size.

2. A method as claimed in claim 1, characterized in that said scanning is such that each spot scans its own associated layer area, which area has dimensions corresponding to the matrix pitch.

3. A method as claimed in claim 1, characterized in that the matrix of spots and the radiation sensitive layer are scanned relative to each other in a direction at a small angle to the direction of the line of spots in the matrix and in that the scanning is carried out over a length substantially larger than the matrix pitch.

4. A method as claimed in claims 1, 2 or 3, characterized in that the between successive sub-illuminations the radiation sensitive layer and the arrays are displaced relative to each other over a distance, which is at most equal to the size of the spots formed in the radiation sensitive layer.

5. A method as claimed in claims 1, characterized in that the intensity of a spot at the border of an image feature is adapted to the distance between this feature border and a neighboring feature.

6. A method as claimed in claim 1, further comprising:
    forming part of a lithographic process for producing a device in a substrate, characterized in that the radiation sensitive layer is a resist layer provided on the substrate and in that the image pattern corresponds to the pattern of features of the device to be produced.

7. A method as claimed in claim 6, characterized in that the image is divided in sub-images each belonging to a different level of the device to be produced and in that during formation of the different sub-images the resist layer is set at different distances from the array of refractive lenses.

8. A method as claimed in claim 1, further comprising:
    forming part of a process for printing a sheet of paper, characterized in that the radiation sensitive layer is a layer of electrostatic charged material.

9. A method as claimed in claim 1, characterized in that the array of light valves is positioned to directly face the array of refractive lenses.

10. A method as claimed in claim 8, characterized in that the array of light valves is imaged on the array of refractive lenses.

11. A method as claimed in claim 1, further comprising:

forming an image, comprising features corresponding to device features to be configured in the process layer, in a resist layer provided on the process layer, and removing material from, or adding material to, areas of said process layer which areas are delineated by the image formed in the resist layer.

12. An apparatus, comprising:

a radiation source;

positioning means for positioning a radiation sensitive layer relative to the radiation beam from the source;

a two-dimensional array of individually controllable light valves arranged between the source and the location for the radiation sensitive layer; and an imaging element comprising an array of converging elements arranged between the array of light valves and the location of the radiation sensitive layer without any intervening imaging elements between the array of radiation converging elements and the array of light valves, wherein each of these radiation convergence elements corresponds to a different one of the light valves and serves to converge radiation from the corresponding light valve in a spot area in the resist layer, characterized in that the converging elements are refractive lenses.

13. An apparatus as claimed in claim 12, further comprising:

means for forming an image in a resist layer on a substrate, which image comprises features corresponding to device features to be configured in said substrate, characterized in that the radiation sensitive layer is a resist layer provided on the substrate and in that the positioning means is a substrate holder carried by a substrate state.

14. An apparatus as claimed in claim 13, further comprising:

means for adapting the distance between the resist layer surface and the array of refractive lenses when forming different sub-images.

15. An apparatus as claimed in claim 12, further comprising:

means for printing data on a sheet of paper, characterized in that the radiation sensitive layer is a layer of electrostatic charged radiation sensitive material and in that the positioning means are means for moving said layer relative to the array of light valves and the array of refractive lenses and for sustaining said layer at the location of the image field of these arrays.

16. An apparatus as claimed in claim 12, characterized in that a distance between the ray of refractive lenses and the resist layer is of the order of 250 μm.

* * * * *